United States Patent [19]

Rice

[11] Patent Number: 5,396,839
[45] Date of Patent: Mar. 14, 1995

[54] APPARATUS AND METHOD FOR PRINTING COLOR IMAGES

[75] Inventor: Vic G. Rice, Santa Clara, Calif.

[73] Assignee: Collor, Mountain View, Calif.

[21] Appl. No.: 949,570

[22] Filed: Sep. 23, 1992

[51] Int. Cl.6 .................. B41F 19/02; B41M 3/00; B41M 1/24

[52] U.S. Cl. ...................... 101/32; 101/211

[58] Field of Search ............ 101/211, 492, 32, 22; 264/1.3, 1.4, 1.7, 22, 132; 427/256, 258, 288; 430/21, 22, 290

[56] References Cited

U.S. PATENT DOCUMENTS

| | | | |
|---|---|---|---|
| 4,441,423 | 4/1984 | Germann | 101/211 |
| 4,788,116 | 11/1988 | Hochberg | 430/21 |
| 4,918,469 | 4/1990 | McGrew | 359/22 |
| 4,933,120 | 6/1990 | D'Amato | 264/1.3 |
| 5,155,604 | 10/1992 | Miekka et al. | 264/1.3 |

*Primary Examiner*—J. Reed Fisher
*Attorney, Agent, or Firm*—Flehr, Hohbach, Test, Albritton & Herbert

[57] ABSTRACT

A method of printing color images which includes the formation of a pattern of three primary color separated halftones of the image from a medium applied to a substrate. The medium is embossed to form a surface relief configuration on each halftone image. Each surface relief configuration reflects one specific primary color at a specific angle. In one embodiment, the medium is applied to a substrate in the pattern of color separated halftone images in a single printing pass by a composite offset printing plate. The medium is then embossed by an embossing plate to create the surface relief configurations thereon. In a second embodiment, the medium is applied to the substrate and embossed by a single plate in a single printing pass. In a third embodiment, the medium is applied to the substrate in a relatively continuous layer and thereafter embossed to simultaneously create a pattern of color separated halftones of the image and a different surface relief configuration on each halftone image. In a fourth embodiment, the medium is applied to the substrate in a relatively continuous layer and thereafter embossed to form a plurality of surface relief configurations thereon. The halftone images are then formed on the embossed medium to produce a full color image by applying a coating over the portions of the medium where the primary colors should not be reflected.

25 Claims, 8 Drawing Sheets

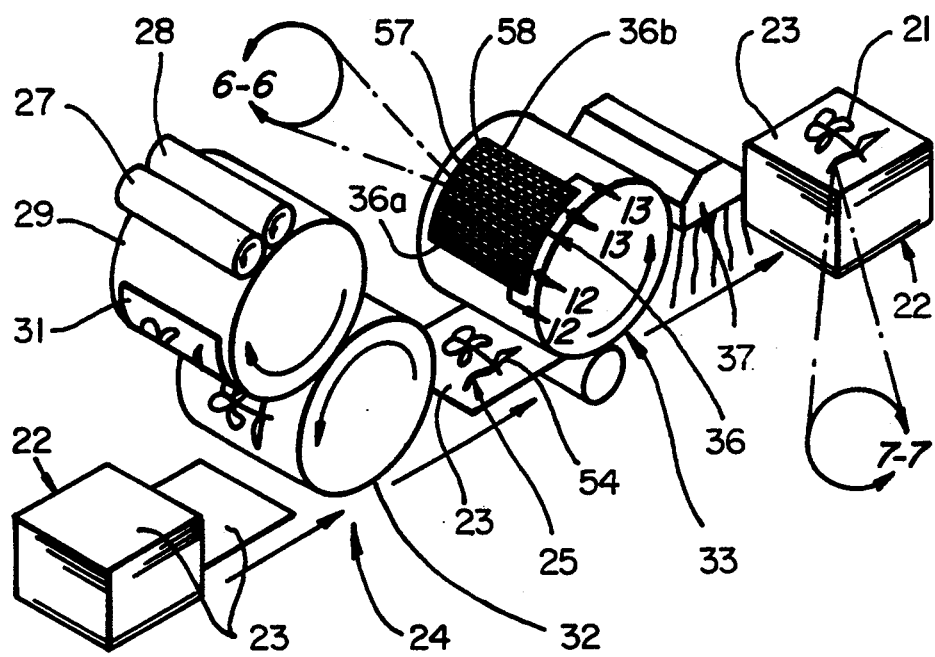
FIG_1
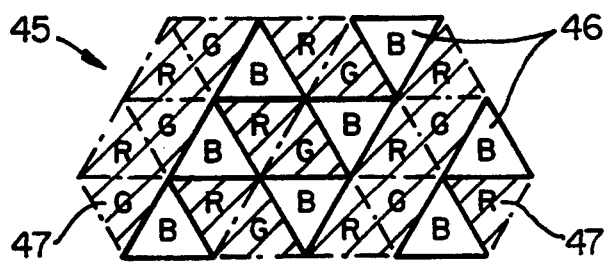
FIG_2
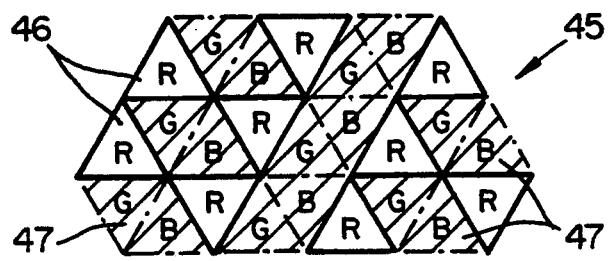
FIG_3

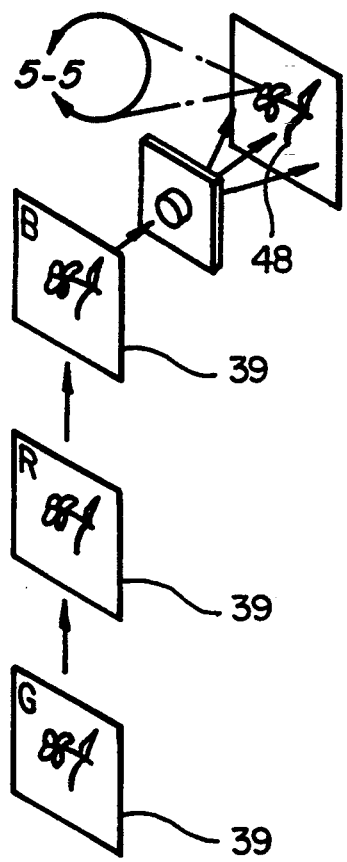
FIG_4
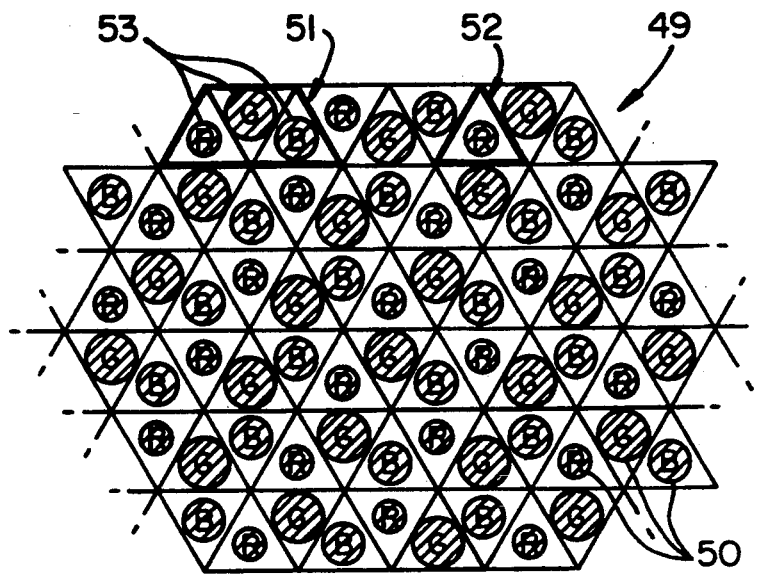
FIG_5

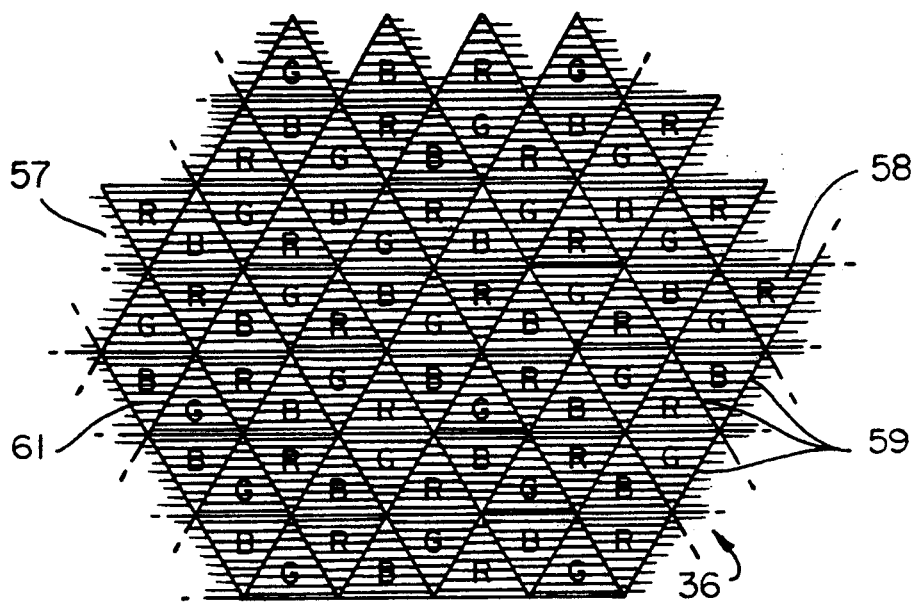
FIG_6
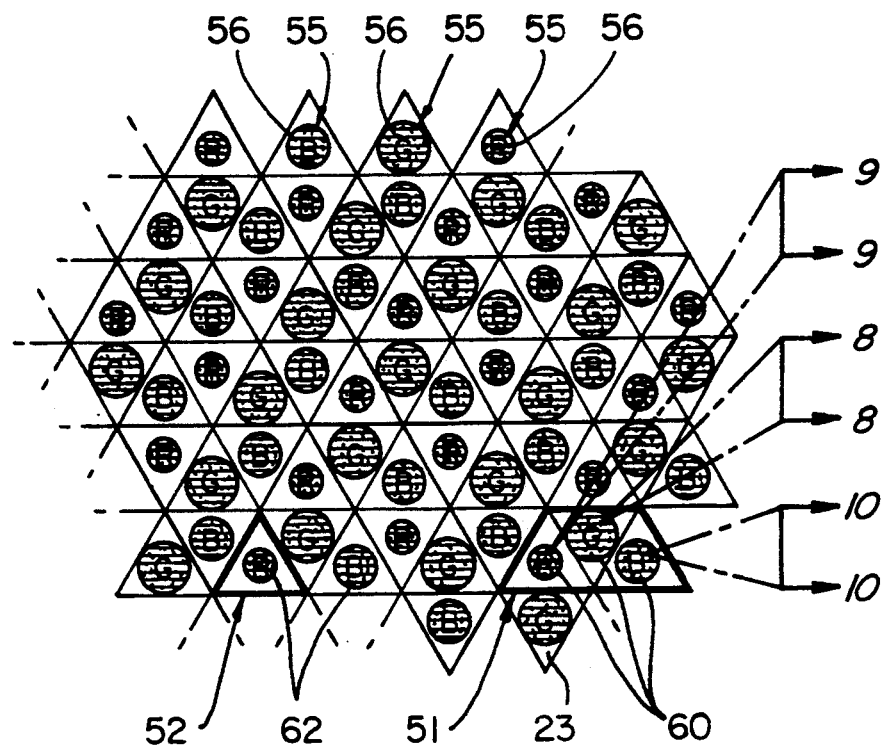
FIG_7

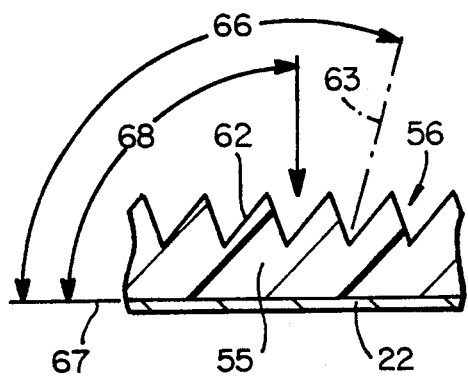
FIG_8
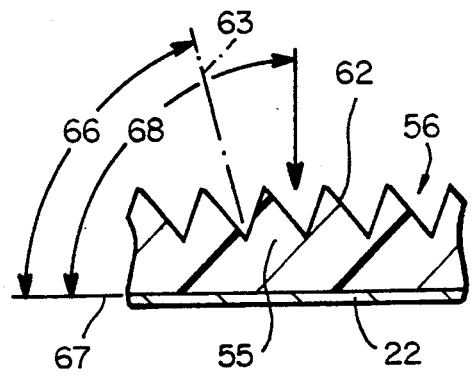
FIG_9
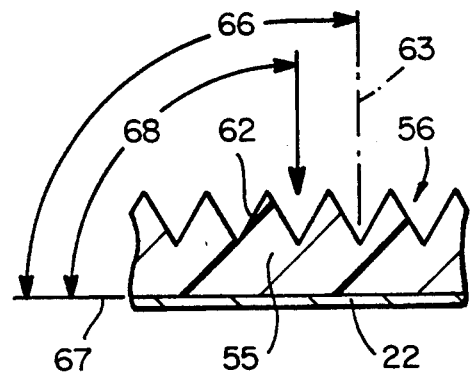
FIG_10
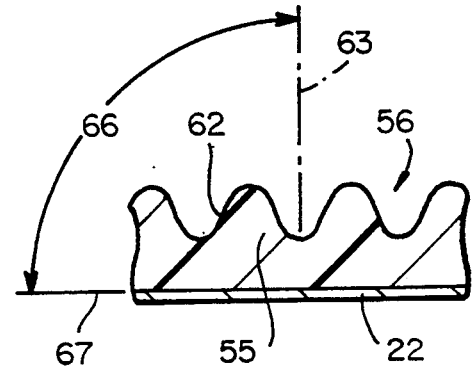
FIG_11
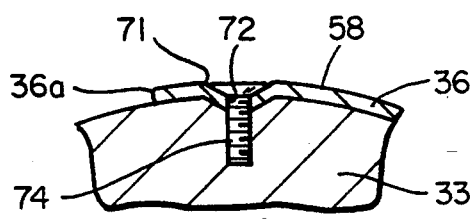
FIG_12
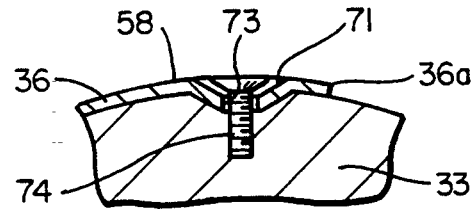
FIG_13

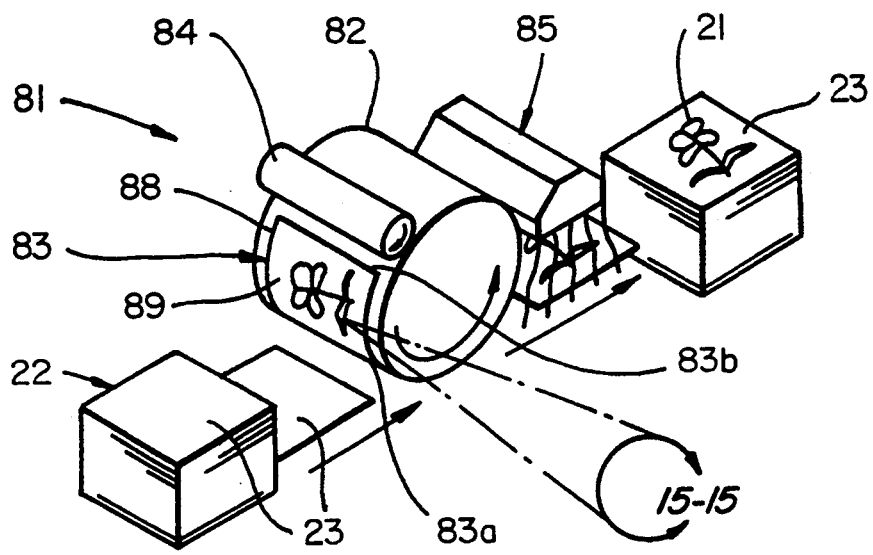
FIG_14
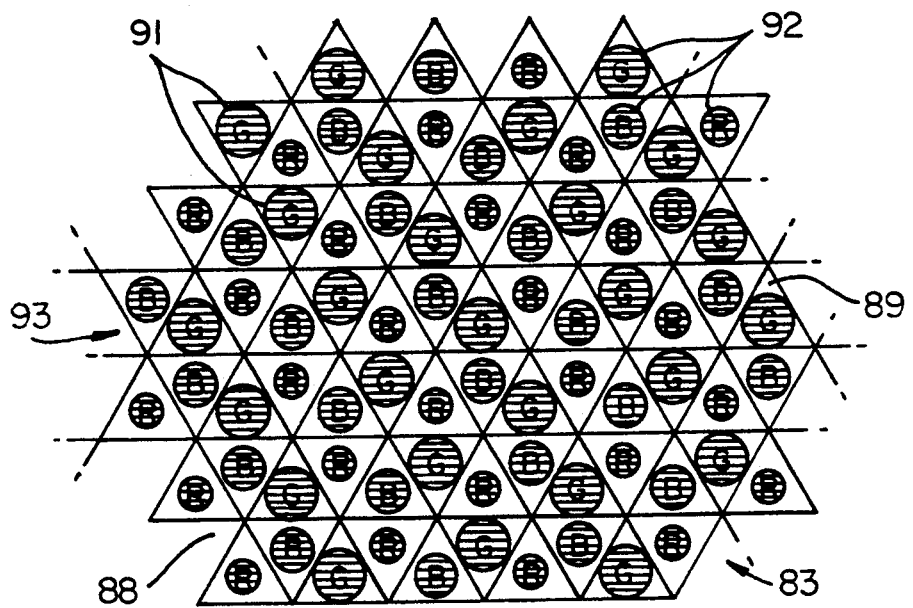
FIG_15

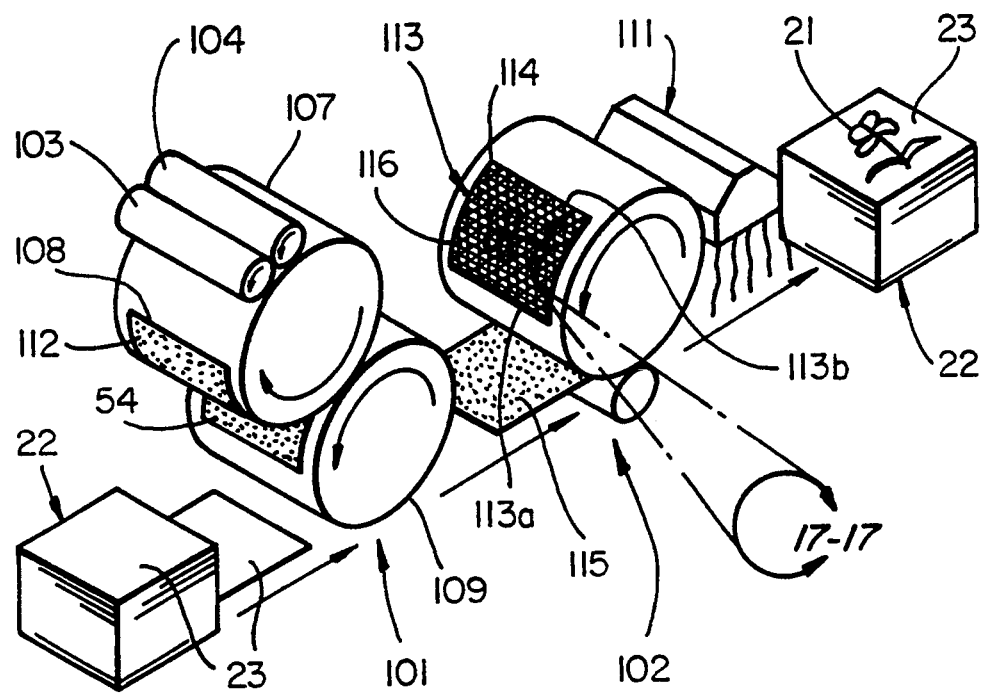
FIG_16
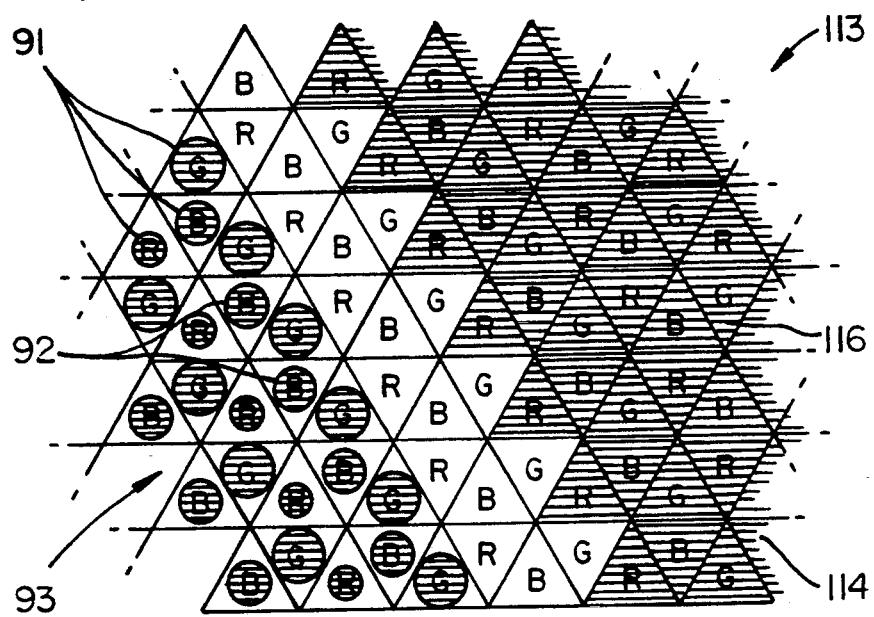
FIG_17

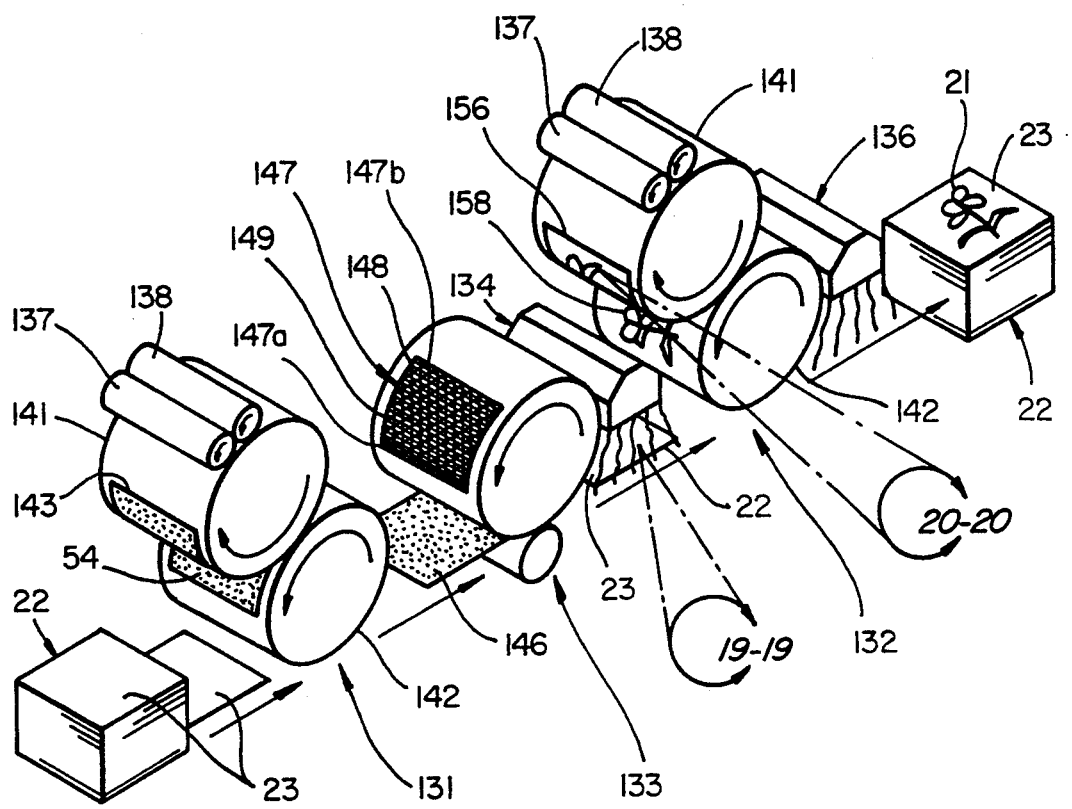
FIG_18
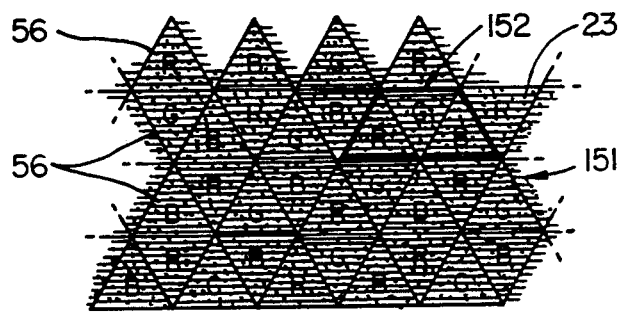
FIG_19

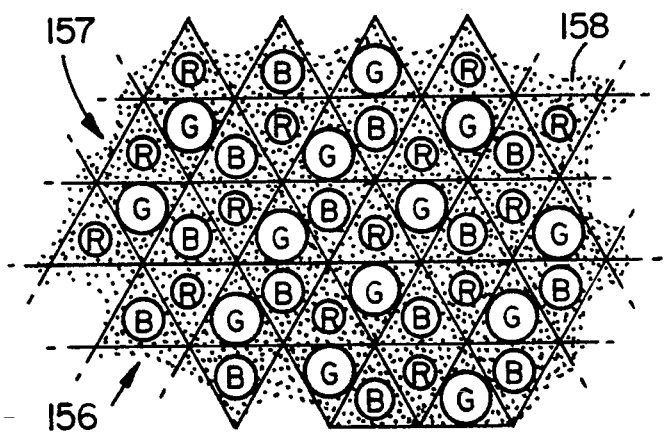
FIG_20
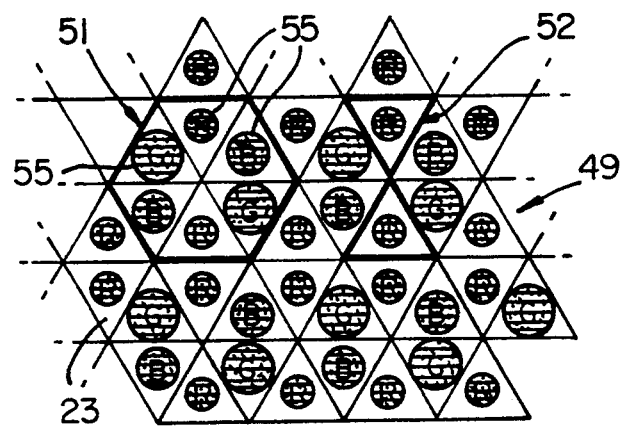
FIG_21
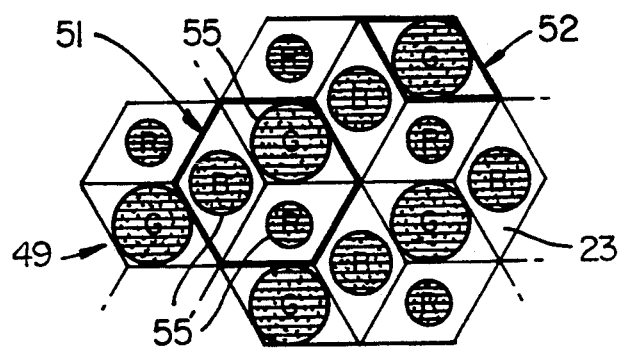
FIG_22

APPARATUS AND METHOD FOR PRINTING COLOR IMAGES

BRIEF DESCRIPTION OF THE INVENTION

This invention relates to an apparatus and method for the printing of color images and more particularly to an apparatus and method for the printing of color images utilizing the optical properties of the printed surface.

BACKGROUND OF THE INVENTION

Printing apparatus and methods have been provided for the ink printing of images. Most commercial printing today is done by relief printing, offset lithography or gravure printing. Briefly, the printing surface is raised above the level of the nonprinting surface in relief printing, while the printing surface is below the nonprinting surface in gravure printing. In offset lithography, or planography, the printing and nonprinting surfaces are on the same level.

In one form of relief printing, a flexible printing plate having a photosensitive plastic over a metal base is mounted to a rotatable cylinder. A negative of the image to be printed is properly aligned and exposed to the plastic causing the image area to harden. The non-image areas remain soft and can be removed, leaving the image areas in relief. The plate is hardened before being attached to the cylinder. Ink is applied to the plate and impressed by the image areas against printing stock passing below the rotating cylinder.

In offset lithography, the most commonly used printing process, the image to be printed is reproduced on a printing plate by a process known as photolithography. In this process, a negative of the image is held up against the surface of a printing plate which has a light sensitive coating thereon. The negative is exposed to light causing the light sensitive coating to harden in the image areas produced thereon. After removing the coating from the nonimage areas and treating the plate with lacquer, which adheres only to the hardened image areas, the nonimage areas are gummed to increase their ability to hold water.

Rotary presses are typically used in lithography to print the image on the printing stock. The printing plate is clamped to a cylinder known as the plate cylinder. As the plate cylinder rotates, the printing plate first engages a water roller which wets the gummed areas so that they will repel ink. The printing plate next engages an ink roller which applies ink to the image areas. The inked image is transferred to a second cylinder known as the blanket cylinder, which in turn transfers the image to the printing stock.

Color images can be reproduced in relief printing, lithography or gravure by a procedure known as process color printing. In general, printing presses use the method of "subtractive" mixing to print full color images. In this method, the picture is not the source of light but merely reflects the desired light. The color image to be printed is created by combining tiny dots of yellow, magenta and cyan on the printing stock. (Black is often used as well to add sharpness to the print.) Each dot creates a certain color of light by absorbing certain colors in the white light falling on it and reflecting other colors. For example, a yellow surface absorbs the blue light in the white light falling on it and reflects the colors red and green to create the color yellow. The light reflected by each dot, together with the light reflected by the adjoining dots, creates the color at that location on the printed image when the dots are viewed from a distance as to not be individually discernable. Accordingly, the presence and size of a dot, together with the presence and size of the other single-color dots which are nearby, determines the color at that location on the image. An eye viewing the printing stock with the tiny colored dots thereon mixes the colors of the dots into all the colors and shades of the original copy.

The single-color dot configured images, known as halftones, of the image to be printed are created by separately photographing the image through a series of filters, each of which blocks out all but the desired color. Each of these photographs is taken through a distinctly configured halftone screen to produce a halftone negative with a dot configuration different from the other halftone negatives. The halftone negatives are used to make separate printing plates for each of these colors. Each printing plate is used with a separate set of cylinders and has its own supply of colored ink. The printing stock passes sequentially through the color printing cylinders, which are arranged so that each halftone image is properly registered with respect to the others.

As discussed above, current color ink printing technology requires a separate printing pass for each of the primary colors. Each pass adds a layer of redundancy to the operation in the form of additional presses and printing plates and is reflected in the cost of color printing. The requirement that each halftone image be properly registered with the others adds a layer of complexity to the standard printing process. Failure to properly register the halftone images results in prints of inferior quality. On the other hand, any new and improved printing technology which requires the replacement of existing presses may be difficult to sell in the already capital intensive and highly competitive print industry.

Apparatus and methods have also been provided for creating color images without the use of ink. Instead, the optical properties of the surface on which the image is created are used to recreate color images through the process of "additive" mixing. In this process, the image is the source of light and typically reflects the primary colors blue, red and green. A pattern of diffraction gratings are created on the printing surface, similar to the pattern of yellow, magenta and cyan dots used to create colors by subtractive mixing, to cause white light falling on the surface to reflect the primary colors. Each location on the image reflects the desired primary color(s) which are combined with primary colors reflected by the adjoining diffraction gratings to produce the desired color at that location on the image. White light is reflected at locations where the primary colors are reflected in approximately equal density. The image does not absorb or subtract colors to produce the desired color.

Unfortunately, existing apparatus and methods for creating color images through additive mixing are expensive. Many require that an expensive embossing plate be custom made with lasers for each image to be printed. These apparatus and methods utilize the process of hot foil stamping to create the color images, and do not utilize standard high volume rotary printing processes.

OBJECTS AND SUMMARY OF THE INVENTION

It is in general an object of the invention to provide a new and improved apparatus and method for printing color images which overcomes the limitations and disadvantages of the color printing apparatus and methods heretofore provided.

Another object of the invention is to provide an apparatus and method of the above character which prints color images in a single pass.

Another object of the invention is to provide an apparatus and method of the above character which can be used with existing printing press equipment and technology.

Another object of the invention is to provide an apparatus and method of the above character which does not require the making of a nonstandard embossing or image plate customized to the image to be printed.

Another object of the invention is to provide an apparatus and method of the above character which uses the optical properties of a surface pattern to produce luminescent color images.

These and other objects are achieved in accordance with the invention by providing a method of printing color images which includes the formation of a pattern of color separated halftones of the image from a medium. In most instances, the medium is applied to a substrate and three primary color halftone images are formed therefrom. Each of the color separated halftone images is created by photographing the image to be printed through a distinctly configured color separation halftone screen having a portion which permits passing of the desired color. The medium is embossed to form a surface relief configuration on each halftone image. Each surface relief configuration reflects one specific primary color at a specific angle.

In one embodiment, the medium is applied to a substrate in the pattern of color separated halftone images in a single printing pass by a composite offset printing plate. The medium is then embossed by an embossing plate to create the surface relief configurations thereon. In a second embodiment, the medium is applied to the substrate and embossed by a single plate in a single printing pass. In a third embodiment, the medium is applied to the substrate in a relatively continuous layer and thereafter embossed to simultaneously create a pattern of color separated halftones of the image and a different surface relief configuration on each halftone image. In a fourth embodiment, the medium is applied to the substrate in a relatively continuous layer and thereafter embossed to form a plurality of surface relief configurations thereon. The halftone images are then formed on the embossed medium to produce a full color image by applying a coating over the portions of the medium where the primary colors should not be reflected.

Additional objects and features of the invention will appear from the following description from which the preferred embodiments are set forth in detail in conjunction with the accompanying drawings.

BRIEF DESCRIPTION OF THE DRAWINGS

FIG. 1 is a pictorial view of an embodiment of a color printing machine which includes portions of the apparatus and method for printing color images of the present invention.

FIG. 2 is an enlarged view of a portion of a blue color separation halftone screen of the present invention.

FIG. 3 is an enlarged view of a portion of a red color separation halftone screen of the present invention.

FIG. 4 is an illustration of a portion of the method of the present invention.

FIG. 5 is an enlargement of a portion of FIG. 4 shown by line 5—5 in FIG. 4, rotated approximately 90 degrees and with a grid pattern superimposed thereon.

FIG. 6 is an enlargement of a portion of FIG. 1 shown by line 6—6 in FIG. 1, rotated approximately 90 degrees and with a grid pattern superimposed thereon.

FIG. 7 is an enlargement of a portion of FIG. 1 shown by line 7—7 in FIG. 1, rotated approximately 90 degrees and with a grid pattern superimposed thereon.

FIG. 8 is an enlarged cross-sectional view of a portion of FIG. 7 looking along the line 8—8 in FIG. 7.

FIG. 9 is an enlarged cross-sectional view of a portion of FIG. 7 looking along the line 9—9 in FIG. 7.

FIG. 10 is an enlarged cross-sectional view of a portion of FIG. 7 looking along the line 10—10 in FIG. 7.

FIG. 11 is an enlarged cross-sectional view, similar to FIGS. 8 through 10, of another embodiment of a color printing machine which includes portions of the apparatus and method for printing color images of the present invention.

FIG. 12 is an enlarged cross-sectional view of a portion of FIG. 1 looking along the line 12—12 of FIG. 1.

FIG. 13 is an enlarged cross-sectional view of a portion of FIG. 1 looking along the line 13—13 of FIG. 1.

FIG. 14 is a pictorial view of another embodiment of a color printing machine which includes portions of the apparatus and method for printing color images of the present invention.

FIG. 15 is an enlargement of a portion of FIG. 14 shown by line 15—15 in FIG. 14, rotated approximately 90 degrees and with a grid pattern superimposed thereon.

FIG. 16 is a pictorial view of another embodiment of a color printing machine which includes portions of the apparatus and method for printing color images of the present invention.

FIG. 17 is an enlargement of a portion of FIG. 16 shown by line 17—17 in FIG. 16, rotated approximately 90 degrees and with a grid pattern superimposed thereon.

FIG. 18 is a pictorial view of another embodiment of a color printing machine which includes portions of the apparatus and method for printing color images of the present invention.

FIG. 19 is an enlargement of a portion of FIG. 18 shown by line 19—19 in FIG. 18, rotated approximately 90 degrees and with a grid pattern superimposed thereon.

FIG. 20 is an enlargement of a portion of FIG. 18 shown by line 20—20 in FIG. 18, rotated approximately 90 degrees and with a grid pattern superimposed thereon.

FIG. 21 is an enlarged view, similar to FIG. 7 and with a grid pattern superimposed thereon, of another embodiment of a portion of a printed image produced from the apparatus and method for printing color images of the present invention.

FIG. 22 is an enlarged view, similar to FIG. 7 and with a grid pattern superimposed thereon, of another embodiment of a portion of a printed image produced from the apparatus and method for printing color images of the present invention.

DETAILED DESCRIPTION OF THE INVENTION

Reference will now be made in detail to the preferred embodiments of the invention, which are illustrated in the accompanying figures. Turning now to the drawings, wherein like components are designated by like reference numerals throughout the various figures, attention is directed to FIGS. 1 through 22. The letters "B", "R" and "G" have been printed on several of the figures to identify the primary colors blue, red and green, respectively.

One embodiment of the apparatus and method of the present invention for printing a color image 21 is shown in FIG. 1. In general, printing stock 22 having surface 23 and serving as the substrate is initially fed through an offset lithography rotary printing press 24 which prints single color image 25. Printing press 24 includes water and ink rollers 27 and 28, a plate cylinder 29 with a composite offset printing plate 31 mounted thereon and a blanket cylinder 32. The diameters of plate and blanket cylinders 29 and 32 should be substantially the same. For simplicity, water and ink supply trays, among other things, are not shown in FIG. 1. Stock 22 is then sequentially fed through rotary color embossing drum 33, which has an embossing plate 36 with first and second end portions 36a and 36b fastened thereto for mechanically impressing color into single color image 25, and a cure station 37.

Printing plate 31 contains a pattern of distinctly configured color separated halftones 39 of image 21. As a first step in making plate 31, a plurality of color separated halftone images 39 are created. More specifically, halftone images 39 are created for the colors blue, red and green, the standard primary colors used for additive color mixing. In the alternative, halftone images 39 could be created for the colors yellow, magenta and cyan, the standard colors used for subtractive coloring mixing. It should be appreciated that color separated halftone images 39 for other colors could be used in substitution of or in combination with these colors and be within the scope of the present invention. Most desirably, the primary colors chosen should be approximately evenly spaced around the color wheel.

Each single color halftone image 39 is produced from a negative created by a suitable means such as separately photographing image 21 through a distinctly configured color separation halftone screen 45. Each halftone screen 45 blocks out all but the desired color and produces a color separated black and white negative of image 21. More specifically, a portion of each screen 45 consists of a configuration of filters 46 which permit passing of only the desired wavelength or color of light. The balance of each screen consists of light shields 47 which block the passage of all light. Each halftone screen 45 has a configuration of filters 46 which is different and distinct from the configuration of filters 46 for each other halftone screen 45. In addition, when all of halftone screens 45 are superimposed upon each other, the filters 46 of each halftone screen 45 are covered by the light shields 47 of each of the other halftone screens 45. As a result, halftone images 39 do not overlap when combined to print single color image 25.

FIGS. 2 and 3 illustrate portions of halftone screens 45 for the colors blue and red, which can be used with another screen 45 for the color green which is not shown in the drawings. Several filters 46 and light shields 47 are identified in these Figures, the nonlight passing light shields 47 being crosshatched. Each filter 46 is approximately in the shape of an equilateral triangle, however filters 46 of other shapes are within the scope of the present invention. Filters 46 for each of the primary colors are of approximately equal size to ensure that the maximum density of each reflected primary color on the printed image is approximately the same. The configuration of filters 46 for the two related screens 45 are superimposed on each of the screens shown in FIGS. 2 and 3 to illustrate the pattern created by the configuration of filters 46 for the blue, red and green halftone screens 45. The third halftone screen 45 for the color green is constructed similar to halftone screens 45 illustrated in FIGS. 2 and 3.

The color separated halftone images 39 are photographically superimposed in proper registration to produce a black and white composite halftone image 48 as illustrated in FIG. 4. Composite image 48 consists of a pattern 49 of color separated blue, red and green halftone images 39 thereon. A portion of a pattern 49 is illustrated in FIG. 5. Each halftone image 39 consists of a plurality of dots 50 in a distinct configuration substantially similar to the configuration of filters 46 on the halftone screen 45 from which they were made.

Pattern 49 is made up of a plurality of pixels or cells 51, each of which are generally in the shape of an isosceles trapezoid. Each pixel 51 is formed from three adjoining elements 52, each generally in the shape of an equilateral triangle and of approximately the same size as a filter 46 in halftone screen 45. Pixels 51 include adjoining dots 50 representing the colors blue, red and green, one dot 50 in each element 52, when those colors are represented at that location on image 21. The location of a dot 50 determines the color, while the size of a dot 50 determines the brightness of the color at that location on image 21. The three color representing dots 50 of each cell 51 are arranged in a similar spatial design 53.

In the portion of composite image 48 illustrated in FIG. 5, only one dot 50 for each represented color and one dot 50 from each halftone image 39 which together form pattern 49 are identified. The size of each dot 50 is dependent not only on the size of the related filter 46 on the related halftone screen 45 (i.e., a dot 50 cannot be larger than the related filter 46), but also on the brightness of that color at that location on image 21. Accordingly, although dots 50 are shown in FIG. 5 as being circular, dots being other than circular can be within the scope of the present invention. Some images 21 may include pixels 51 with one or more dots 50 the size of filters 46.

One pixel or cell 51 is also shown in FIG. 5, with a spatial design 53 of color representing dots 50 consisting of a central green dot 50 and adjoining red and blue dots 50 on each side thereof. It should be appreciated that other pixels 51 having other spatial designs 53 of color representing dots 50 therein could be chosen from pattern 49, as illustrated in FIG. 5, and be within the scope of the present invention. In addition, the shape and structure of each pixel 51 is dependent on the shape and configuration of the related filters 46 on halftone screens 45. Thus, composite images 48 having pixels 51 with other spatial designs 53 of dots 50 and shapes, including an image 48 having pixels 51 with differing spatial designs 53 of dots 50 and/or shapes, are within the scope of the present invention.

Once color separated halftone images 39 have been combined to produce composite halftone image 48, image 48 is photolithographically reproduced on printing plate 31 so that pattern 49 of color separated blue, red and green halftone images 39 are contained thereon. If printing stock 22 has a surface 23 which is other than white, composite halftone image 48 on printing plate 31 may need to be adjusted so that white is created where desired on printed image 21 when the medium applied to the printing stock is embossed in the manner discussed below.

The method step of applying a medium or coating on surface 23 of printing stock 22 to produce single color image 25, which has a pattern 49 of color separated halftones 39 of image 21, is performed by printing press 24 through the process of offset lithography. Press 24 operates in the same manner as a standard offset press, except that the application of the medium is performed in a single printing pass by printing plate 31. The medium is formed on printing stock 22 in a pattern 49 of halftone images 39 and can consist of a thermosetting, photopolymer or similar heat setting deformable ink 54. Ink 54 can be any single color, and is shown in the drawings as a single color. However, ink 54 can also be clear or transparent and be within the scope of the present invention. It should also be appreciated that each halftone image 39 could be formed on printing stock 22 by a separate printing plate and press and be within the scope of the present invention.

Plate cylinder 29, with printing plate 31 mounted thereon, rotates so that printing plate 31 first engages water roller 27 and then ink roller 28. Ink 54 from ink roller 28 sticks only to composite image 48 on plate 31 and is passed to blanket cylinder 32 at the point where plate and blanket cylinders 29 and 32 rotatably engage to create a mirror image of composite image 48 on blanket cylinder 32. Ink 54 is then passed and disposed by blanket cylinder 32 onto surface 23 of printing stock 22 being fed to engage the blanket cylinder, with the mirror image on the blanket cylinder being transposed to produce and form single color image 25 on surface 23. Single color image 25 is substantially identical to composite image 48 and includes the three color separated blue, red and green halftone images 39.

Single color image 25 formed by ink 54 on printing stock 22 retains pattern 49 of halftone images 39, with each dot 50 of a halftone image now manifested by a correspondingly located ink dot 55 on printing stock 22. Ink dots 55 from the three primary color blue, red and green halftone images 39 are arranged in cells 51, each having a spatial design 53, substantially similar to cells 51 on printing plate 31.

The method step of embossing ink dots 55 on surface 23 to form a different surface relief configuration such as a diffraction grating 56 on each color separated halftone image 39 in composite image 48 on printing stock 22 is performed by embossing drum 33 with embossing plate 36 thereon. Embossing drum 33 is similar to a relief rotary printing press. Diffraction gratings 56 are shaped by embossing plate 36, which includes a sheet 57 having a surface 58 adapted for engagement with ink dots 55. Surface 58 of embossing plate 36 must be at least as large as single color image 25 printed on printing stock 22. Although FIG. 1 shows an embossing plate 36 covering only a portion of embossing drum 33, a larger embossing plate 36 covering the entire outer surface of embossing drum 33 would be within the scope of the present invention. Surface 58 contains a separate and distinct configuration of elements 59 thereon corresponding to each distinct configuration of filters 46 of the blue, red and green halftone screens 45, each configuration of elements 59 being a mirror image of the related configuration of filters 46. Each element 59 is approximately in the shape of an equilateral triangle; several elements 59 are identified in FIG. 6.

The portion of surface 58 occupied by each configuration of elements 59 on embossing plate 36 is constructed to produce a diffraction grating 56 on ink dots 55 which is different from the diffraction grating 56 produced by the portion of surface 58 occupied by each of the other configuration of elements 59 when embossing plate 36 engages imaged printing stock 22 (See FIGS. 7 through 10). Imaged printing stock is registered with respect to embossing drum and plate 33 and 36 such that each configuration of blue, red and green related elements 59 on embossing plate 36 contacts the related halftone image 39 reproduced by ink dots 55 on surface 23 of printing stock 22 when embossing plate 36 is pressed against ink dots 55 on the passing printing stock imaged with composite image 48. By so embossing ink dots 55, each diffraction grating 56 produced on ink dots 55 by each element 59 of a configuration on embossing plate 36 is part of a pixel 51, with each pixel 51 including three elements 52 and embossed with the same design 60 of different diffraction gratings.

Each element 59 of a configuration on embossing plate 36 is provided with a plurality of substantially parallel grooves 61 which when pressed against an ink dot 55 produce substantially the same diffraction grating 56 comprised of a plurality of close equidistant and substantially parallel lines or grooves 62. Each groove 62 is symmetrical about a groove centerline 63 and similarly dimensioned. Most desirably, grooves 62 produced by each configuration of elements 59 are substantially parallel. The angle of groove centerline 63 of each diffraction grating 56 produced by a configuration of elements 59, identified in the figures by angle 66 measured from plane 67 formed by the printing surface of printing stock 22, is different from angle 66 of the groove centerline 63 of each diffraction grating -56 produced by the other configurations of elements 59. Grooves 62 can be "V" shaped as illustrated in FIGS. 8 through 10. In addition, grooves 62 can be parabolic and/or have other shapes and configurations not shown in the drawings which produce the desired effect and be within the scope of the present invention.

As will be appreciated by those skilled in the art, light directed at diffraction gratings is diffracted to produce light beams which reflect in such a way as to produce spectra. By viewing the spectra of light produced by a diffraction grating at different ranges of angles, different wavelengths or colors of light can be seen. The effective width of a groove in the diffraction grating when viewed at a specific range of angles determines which color of light is seen at those angles. Accordingly, the color of light reflected by a diffraction grating at a specific range of angles is dependent upon the configuration of the grating (i.e., the angle 66 of groove centerline 63 from plane 67 in FIGS. 8 through 10) and the closeness of the grooves forming the diffraction grating.

Each of diffraction gratings 56 reflects one specific different color at a specific angle. FIGS. 8, 9 and 10 illustrate similarly configured diffraction gratings 56 formed by embossing plate 36 on ink dots 55 forming the blue, red and green halftone images 39 carried by printing stock 22. Each of these diffraction gratings is substantially "V" shaped in cross-section and has a groove centerline 63 located at a different angle 66 from plane 67. These diffraction gratings are aligned on ink dots 55 such that they reflect the colors blue, red and green at a range of angles centered on a specific angle, identified in the figures by angle 68 measured from plane 67 at the point of viewing, which is the same for each diffraction grating. Most desirably, this one specific angle 68 is approximately 90 degrees. In this manner, diffraction gratings 56 produced on ink dots 55 of the blue, red and green halftone images 39 by the related configuration of elements 59 on embossing plate 36 reflect the colors blue, red and green, respectively, when viewed from common angle 68. The range of viewing angles for which a specific color can be viewed is dependent upon the shape of grooves 62 in diffraction gratings 56.

When embossed by embossing plate 36, a plurality of diffraction gratings 56 are produced on ink 54. More specifically, ink dots 55 on surface 23 have at least three different diffraction gratings 56 formed thereon to provide three different colors and ink dots 55 reproduce image 21 in full color when printing stock 22 is viewed at the appropriate angle 68. The full color is produced through the process and method of additive mixing by the combination of color separated halftone images 39 in pattern 49. As discussed above, each ink dot 55 of a halftone image 39 is embossed with the same diffraction grating 56. As will be appreciated by those skilled in the art, blue, red and green are three primary colors which can be combined in various combinations through additive mixing to produce most other colors. By varying the amount of each of these colors reflected by ink dots 55 in a pixel 51 (i.e., the size of ink dots 55 in a pixel 51 embossed with blue, red and/or green reflecting diffraction gratings 56), pixel 51 can as a whole be adjusted to reflect different colors.

By way of example, a pixel 51 with only a large ink dot 55 embossed to reflect blue would reflect the color blue. A pixel 51 with equally sized ink dots 55 embossed to separately reflect blue and red would reflect the color magenta. A pixel with substantially equally sized blue, red and green ink dots 55 would reflect white. If white is produced in this manner, however, printing plate 31 may need to be modified so that substantially equally sized blue, red and green ink dots 55 are applied to stock 22 at the location of image 21 where white is desired.

The color of printing stock 22 where color image 21 is printed can affect the color print of image 21. White can be produced by using printing stock 22 which is white and not printing ink 54 on pixels 51 desired to be white. Black can be created by a surface which absorbs all colors falling on it. Black can also be created by a surface, such as a smooth silver surface with no diffraction gratings thereon, which does not reflect light perceptible to the eye. Accordingly, black in image 21 can represented by printing image 21 on printing stock 22 having either of these qualities and not printing and embossing pixels 51 on stock 22 at locations where black is desired. If black is represented in this manner, however, printing plate 31 may need to be modified so no ink 54 is disposed on printing stock 22 at the locations where black is desired. Printing stock 22 with a black producing background has the additional advantage of not reflecting unwanted colors which can distort the color desired to be produced by a pixel 51. Conversely, printing stock with a white background where image 21 is to be printed tends to lighten the color print of image 21 because the portions of pixels 51 not covered by ink 54 reflect all light falling on them. As can be seen, the color of printing stock 22 onto which image 21 is printed controls the color of printed image 21 where ink 54 is not applied and embossed and where any transparent ink is applied and not embossed.

After ink dots 55 on printing stock 22 are embossed by embossing drum 33, the printing stock is fed through cure station 37 where ink 54 is cured and solidified by a suitable means such as heat, ultraviolet light or an electron beam. Cure station 37 in FIG. 1 solidifies ink 54 through the use of ultraviolet light. When cured, stock 22 with image 21 thereon is best viewed when diffraction gratings 56 are approximately perpendicular to the light beam of the dominant light source. Accordingly, if the dominant light source is sunlight from above the viewer's head, image 21 is best viewed if diffraction gratings 56 are approximately horizontal to the eye.

As will be appreciated by those skilled in the art, embossing plate 36 can be made by various means such as by creating a mold of the pattern of diffraction gratings 56 to be produced thereby and through the process of electroplating create the embossing plate from a suitable material such as nickel cobalt. Although the "V" shaped diffraction gratings 56 shown in FIGS. 8 through 10 were produced from a mechanically produced mold, the mold can be created by various other known processes such as coating a plate with a photosensitive material and creating the needed diffraction gratings 56 therein by properly and systematically impinging two laser beams thereon. Grooves 62 are created by the fringe pattern produced by the colliding beams and are substantially parabolic or sinusoidal in shape (See FIG. 11). The configuration of each groove 62 is determined by the spacing of the coherent laser light waves and the angle at which the two waves intersect. Masking can be used to identify the portions of the plate to be worked on at a particular time, and color separation halftone screens 45 can be used in this regard. Each groove 62 ranges from two to 200 angstroms in depth, with approximately 1,500 grooves created across each millimeter of the mold.

Embossing plate 36 is formed with funnel shaped recesses 71 in first and second end portions 36a and 36b which are provided with bores 72 and 73 therein. Embossing plate 36 is fastened to embossing drum 33 in a suitable manner such as by screws 74 which are disposed in bores 72 and 73. Bores 73 are oblong in cross-section along the direction of travel of plate 36 on embossing drum 33 to permit any creep of embossing plate 36 during operation of embossing drum 33. A cross-sectional view of a bore 72 is illustrated in FIG. 12, and a cross-sectional view of a bore 73 is illustrated in FIG. 13. Recesses 71 prevent screws 74 from protruding from surface 58. Most desirably, recesses 71 and bores 72 and 73 are located near the perimeter of embossing plate 36 so as not to affect the embossing performed by the embossing plate.

In operation, printing press 24 has fewer steps than a standard offset color printing press. Standard color separated halftone images 39 are created, but they are not printed separately in separate printing passes. Instead, a composite image 48 is created from halftone images 39 and printed in a single printing pass in a single color of ink 54. The apparatus and method of the present invention eliminates the need for three printing passes and the accompanying complexities required to properly register the separately printed images. Embossing drum 33 can be used sequentially with standard printing press 24 and uses an embossing plate 36 which need not be customized for printing different images. Ink 54 can be any color because the color in image 21 is produced by diffraction gratings 56 formed on ink dots 55, not the color of ink 54.

Images 21 printed by the apparatus of the present invention are of high resolution and have luminescent qualities that cannot be achieved with existing print technology. The high resolution is made possible by the fineness of the configuration of filters 46 on halftone screens 45, which results in ink dots 55 created by each halftone image 39 which are close together and a high density of pixels 51 in composite image 48. The luminescence of printed image 21 is attributable to the light being reflected in planar as opposed to diffused waves. In addition, the ability to print with a single color ink 54 eliminates reductions in print resolution caused by the blending of different colored inks. The method and operation uses a standard and reusable embossing plate 36, and does not require that a custom embossing plate be manufactured with lasers or other expensive equipment for each image to be printed.

In another embodiment of the apparatus and method for printing color images of the present invention, a single relief rotary printing press 81 having a plate cylinder 82, with a single relief printing and embossing plate 83 fastened thereto, and an ink roller 84 is utilized for printing color images 21 in a pattern 49 of color separated halftone images 39 on printing stock 22 (See FIG. 14). In this embodiment, the application of ink 54 on printing stock 22 in a pattern 49 of color separated halftone images 39 and the embossing of ink dots 55 to form different diffraction gratings 56 on each halftone image 39 is simultaneously performed by plate 83 in a single printing pass. This embodiment also includes a cure station 85, substantially similar to cure station 37, for curing ink 54 once it has been applied to and embossed on printing stock 22.

Plate 83 is both a printing plate and an embossing plate and has first and second end portions 83a and 83b fastened to printing press 81 in a suitable manner such as discussed above with respect to embossing plate 36. Plate 83 includes a sheet 88 with a surface 89 thereon substantially identical to surface 58 of embossing plate 36 and adapted for engagement with ink 54. A mirror image of composite image 48 is formed in relief on surface 89, which contains a separate configuration 91 of elements 92 for producing each blue, red and green halftone image 39 on printing stock 22. Configurations 91 are shown in FIG. 15 with ink 54 thereon. Each configuration 91 of elements 92 is generally a mirror image of the related halftone image 39. For simplicity, only a single element 92 of each configuration 91 is identified in FIG. 15. Configurations 91 are in a pattern 93 which is substantially similar to pattern 49. More specifically, pattern 93 is a mirror image of pattern 49. The portion of surface 89 occupied by each configuration 91 of elements 92 is formed to produce a diffraction grating 56 on ink 54 applied to printing stock 22 thereby different from the diffraction grating 56 produced by the portion of surface 89 occupied by each of the other configurations 91 of elements 92 to ink 54 applied to the printing stock thereby.

Plate 83 is easily created from a standard embossing plate substantially identical to embossing plate 36 and a positive film image of composite halftone image 48. As will be appreciated by those skilled in the art, composite image 48 can be so formed on surface 89 by any suitable process such as photoetching. In general, a photoresist is applied to surface 89 and a positive film image of composite image 48 exposed thereon. The exposed photoresist on the nonimage areas is removed and the portion of surface 89 thereunder acid etched such that the image area is in relief when the unexposed photoresist is thereafter removed. Where white is desired to be reflected by ink 54 applied to printing stock 22, elements 59 on the embossing plate should be masked so that the embossed pixel 51 has equally sized embossed ink dots 55 for each of the primary colors therein.

The method of printing press 81 is the same as the method performed by printing press 24 and embossing drum 33, except that the application and embossing of ink 54 is performed simultaneously instead of sequentially. As plate cylinder 82 rotates, it engages ink roller 84 which applies a single color ink 54 to plate 83. Ink 54 is applied to and embossed on printing stock 22 by plate 83 as plate cylinder 82 rotatably engages printing stock 22 being fed thereby. Each element 92 on plate 83 creates and embosses an ink dot 55 on the printing stock. Ink 54 on plate 83 in pattern 93 of halftone images 39 is transferred to printing stock 22 to produce pattern 83 of halftone images 39 thereon. The composite image 48 produced on printing stock 22 by the method and apparatus generally shown in FIG. 14 is substantially identical to the composite image 48 produced by the method and apparatus generally shown in FIG. 1, and reflects light and produces color in substantially the same manner as described above to reproduce image 21 in full color.

The apparatus and method of the embodiment generally illustrated in FIG. 14 further simplifies the color printing process of the present invention by simultaneously applying and embossing single color ink 54 in a single printing pass. By reducing to one operation the two operations of printing press 24 illustrated in FIG. 1, any concerns or complications relating to the need to correctly align or register the two operations is eliminated.

In another embodiment of the apparatus and method for printing color images of the present invention, a plurality of halftone images 39 are formed from ink 54, which serves as the medium, and also simultaneously embossed to form a plurality of diffraction gratings 56 thereon. An offset lithography rotary printing press 101, substantially similar to printing press 24, is used in sequence with a rotary embossing drum or press 102, substantially similar to drum 33 (See FIG. 16). Printing press 101 includes water and ink rollers 103 and 104, a plate cylinder 107 with an offset printing plate 108 fastened thereto and a blanket cylinder 109, in each case, substantially similar to the related components in printing press 24. The medium can consist of ink 54. This embodiment also includes a cure station 111, substantially similar to cure station 37.

The method step of applying ink 54 on printing stock 22 is performed by rotary printing press 101. Unlike the embodiment generally illustrated in FIG. 1, printing plate 108 contains no photolithographic or other reproduction of image 21. Instead, printing plate 108 has a surface 112 designed to receive ink 54 over an area at least as large as image 21. Printing press 101 applies ink 54 to printing stock 22 in a substantially uniform and continuous sheet or layer 115 over the area to be imaged thereon.

The method step of embossing layer 115 of ink 54 to form pattern 49 of color separated halftones 39 of image 21 on layer 115 and a different diffraction grating 56 on each halftone image 39 is performed by embossing drum 102 in a single pass. Embossing drum 102 has a plate 113 with first and second end portions 113a and 113b fastened to drum 102 in a suitable manner such as discussed above with respect to embossing plate 36. Plate 113 has a sheet 114 with a surface 116 adapted for engagement with ink 54. Surface 116 is sized in the same manner that surface 58 of embossing plate 36 is sized. In a single operation, plate 113 presses against layer 115 to simultaneously form halftone images 39 thereon in a pattern 49 and emboss ink 54 to produce a different diffraction grating 56 on each halftone image 39. Although the medium in the form of layer 115 of ink 54 has been shown as being applied to a substrate such as printing stock 22, layer 115 of ink 54 may be formed with sufficient thickness so as to be used independent of and without need of the substrate.

Plate 113 is made from a standard embossing plate substantially identical to embossing plate 36 in substantially the same manner as described above with respect to plate 83. Surface 116 on plate 113 is substantially similar to surface 89 on printing and embossing plate 83 in that it is substantially identical to surface 58 of embossing plate 36 and has a mirror image of composite image 48 formed in relief thereon. As such, surface 116 contains a separate configuration 91 of elements 92 for producing each blue, red and green halftone image 39 on ink 54. Configurations 91 are in a pattern 93. Pattern 93 and configurations 91 of elements 92 on surface 116 are illustrated in FIG. 17 where, for simplicity, only several elements 92 of configuration 91 for the color blue are identified. The portion of surface 116 occupied by each configuration 91 of elements 92 is formed to produce a diffraction grating 56 on ink 54 different from the diffraction grating 56 produced by the portion of surface 89 occupied by each of the other configurations 91 of elements 92 on ink 54.

The method of printing press 101 and embossing drum 102 has similarities to the method of both printing press 24 and embossing drum 33 and the method of printing press 81. Printing press 101 operates in substantially the same manner as printing press 24 except that printing plate 108 serves to apply ink 54 in a relatively continuous layer 115 on printing stock 22. No halftone images 39 are created on printing stock 22 by press 101. Embossing drum 102 embosses layer 115 to simultaneously create color separated blue, red and green halftone images 39 on ink 54 and color the images by producing different diffraction gratings 56 on each halftone image 39. The colors in the print of image 21 are created in substantially the same manner as discussed above. In this embodiment, the color of ink 54 controls the color of printed image 21 where ink 54 is not embossed unless a transparent ink is used, in which case the color of printing stock surface 23 onto which image 21 is printed controls. As discussed above, transparent ink 54 can also be used and embossed to reflect the desired colors in printed image 21.

The apparatus and method of the embodiment generally illustrated in FIG. 16 also simplifies the color printing process of the present invention generally illustrated in FIG. 1. Since no halftone images 39 are created on printing stock 22 by the operation of printing press 101, any concerns or complications relating to the need to correctly align or register that operation with the operation of embossing drum 102 are minimized. Any registration between the two operations need only ensure that the embossing by drum 102 occurs on layer 115 of ink 54 placed on printing stock 22 by press 101.

In another embodiment of the apparatus and method for printing color images of the present invention, the medium, in the form of ink 54, is embossed to form a plurality of diffraction gratings 56 thereon before a plurality of halftone images 39 are formed on ink 54. First and second offset lithography rotary printing presses 131 and 132, each substantially similar to printing press 24, are used in sequence with a rotary embossing drum or press 133, substantially similar to embossing drum 33, sandwiched therebetween (See FIG. 18). First and second cure stations 134 and 136, each substantially similar to cure station 37, are also utilized in this embodiment". First cure station 134 is sandwiched between embossing drum 133 and second printing press 132, and second cure station 136 follows second printing press 132. Printing presses 131 and 132 each include water and ink rollers 137 and 138, a plate cylinder 141 and a blanket cylinder 142, in each case, substantially similar to the related components in printing press 24.

The method step of applying ink 54 on printing stock 22 is performed by first rotary printing press 131 which has an offset printing plate 143, substantially similar to printing plate 108, mounted on plate cylinder 141 thereof. As such, first printing press 131 applies ink 54 to printing stock 22 in a substantially uniform and continuous sheet or layer 146 over the area to be imaged thereon prior to embossing of ink 54.

The method step of embossing layer 146 of ink 54 to form a plurality of diffraction gratings 56 thereon is performed by embossing drum 133 in a single pass. Embossing drum 133 has an embossing plate 147, substantially identical to embossing plate 36, with first and second end portions 147a and 147b fastened to drum 133 in substantially the same manner that embossing plate 36 is fastened to embossing drum 33. Embossing plate 147 has a sheet 148 with a surface 149 substantially identical to surface 58 on embossing plate 36.

Embossing drum 133, with embossing plate 147 thereon, embosses layer 146 to produce a pattern 151 of different diffraction gratings 56 thereon. A portion of a pattern 151 is illustrated in FIG. 19. The configuration of pattern 151 is substantially identical to the configuration of pattern 49, and includes a plurality of pixels 152 substantially identical to pixels 51. Each diffraction grating 56 in a pixel 152 reflects a different primary color, either blue, red or green, when layer 146 is viewed at a specific angle. Each pixel 152 contains full and equally sized ink dots 55 for each of the three primary colors and accordingly reflects white.

The method step of forming a plurality of halftone images 39 from ink layer 146 is performed by second rotary printing press 132 which has a composite offset printing plate 156, substantially similar to composite offset printing plate 31, mounted on plate cylinder 141 thereof. Printing plate 156 has a pattern 157, substantially identical to pattern 49, of distinctly configured blue, green and red primary color separated halftone images 39 thereon. Printing plate 156 is created from halftone images 39 combined to produce a composite image 48 in the same manner as printing plate 31, except that a negative or reverse as opposed to a positive of composite image 48 is photolithographically reproduced thereon. As a result, a negative of each dot 50 of each halftone image 39 is produced in each pixel 51 on printing plate 156 illustrated in FIG. 20 with ink 158 thereon.

Second rotary printing press 132 operates in substantially the same manner as printing press 24, with printing plate 156 serving to apply in a single printing pass a coating in the form of ink 158 over portions of diffraction gratings 56 where the related primary color should not be reflected. Once coated, the primary color reflecting surface relief configuration of these portions of diffraction gratings 56 cease reflecting their designated primary color. In this manner, distinctly configured color separated halftone images 39 are produced on embossed layer 146 of ink 54 to form full color printed image 21 thereon. Each halftone image 39 has a different diffraction grating 56 thereon which reflects a different blue, green or red primary color. Ink 158 applied by second press 132 can be any standard printing ink so long as it has a density and composition sufficient to cover the desired portions of diffraction gratings 56 and not flow over undesired portions thereof. Ink 158 can be of any color as the color reflected thereby should in most instances be insignificant compared to the color reflected by the related pixel. Ink 158 can also be transparent. Preferably, however, ink 158 should be black so as to absorb all white light falling thereon. Where a pixel 152 is to reflect all white color falling thereon, no ink 158 should be applied thereon.

First and second cure stations 134 and 136 operate in substantially the same manner as cure station 37, with first cure station 134 curing and drying layer 146 of ink 54 after it has been embossed by embossing drum 133, and second cure station 136 curing and drying ink 158 after it has been applied over embossed layer 146 to form halftone images 39 thereon. It should be appreciated that one of cure stations 134 and 136 may be able to be eliminated from the process of this embodiment and be within the scope of the present invention. For example, if a standard evaporative ink is used as ink 158, second cure station 136 is not needed. In addition, the application of layer 146 of ink 54 by first printing press 131, the embossing thereof by embossing drum 133 and the curing by cure station 134 may be performed in a separate operation apart from the application of ink 158 by second printing press 132 and be within the scope of the present invention.

The apparatus and method of the embodiment generally illustrated in FIG. 18 has similarities to the embodiment generally illustrated in FIG. 1 and to the embodiment generally illustrated in FIG. 16. A standard and reusable embossing plate 147 is used, eliminating the need for a custom embossing plate to be manufactured for each image to be printed. The colors in the print of image 21 are created in substantially the same manner as discussed above. In addition, this embodiment permits the application of layer 146 of ink 54 on printing stock 22 and the embossing thereof by standard embossing plate 147 to be performed in a separate operation from the formation of halftone images 39 thereon by second printing press 132. As a result, a layer 146 of ink 54 can be applied to printing stock 22 and embossed with diffraction gratings 56 at one location, and then sold or provided to persons with standard printing presses for printing color images thereon. These standard printing presses can be used to apply ink 158 in the manner discussed above with standard printing plates, such as printing plate 156, containing one or more halftone images 39 thereon to form full color images on embossed ink layer 146.

In another embodiment of the apparatus and method for printing color images of the present invention, pattern 49 of distinctly configured color separated halftone images 39 on printed image 21 is formed from a plurality of pixels 51 generally hexagonal in shape. Each pixel 51 is formed from three elements 52, one for each of the three primary colors represented in the pixel. Each element 52 is generally equal in size and in the shape of a bow tie and formed from two opposed equilateral triangles in the pixel (See FIG. 21). An embossed ink dot 55 is present in an element 52 when the related color is present at that location on printed color image 21. Pattern 49 and pixels 51 illustrated in FIG. 21 are similar to pattern 49 and pixels 51 shown in FIG. 7 in that each are formed from a plurality of elements 52 generally in the shape of an equilateral triangle. As one can appreciate, numerous patterns 49 can be created from such triangular shaped elements 52. With respect to each such pattern 49, numerous pixels 51 can be formed from the arrangement of elements 52 in the pattern.

In its preferred embodiment, pattern 49 is formed from a plurality of pixels 51 generally hexagonal in shape, with each pixel 51 consisting of three diamond shaped elements 52 approximately equal in size (See FIG. 22). Diamond elements 52 for each primary color halftone image 39 are angled approximately 60 degrees from the diamond elements 52 for the two other primary color halftone images 39, and are each formed from two equilateral triangles with adjoining sides. An embossed ink dot 55 is present in an element 52 when the related color is present at that location on printed color image 21. Among other things, pattern 49 illustrated in FIG. 22 facilitates the manufacture of the related embossing plate. A related halftone screen 45 can be used for masking purposes in creating the embossing plate and merely realigned approximately 60 degrees for creating each configuration of elements 59 thereon.

As can be seen from the above discussion, the present invention provides an apparatus and a method for printing color images which overcome the limitations and disadvantages of the color printing processes and apparatus heretofore provided. The apparatus and method can be used with existing press equipment and technology to print color images in a single pass. In several embodiments, a nonstandard embossing plate customized to the image to be printed is not required. The apparatus and method use the optical properties of a surface pattern to produce luminescent color images. While only certain presently preferred embodiments have been described in detail, as will be apparent to those familiar with the art, certain changes and modifications can be made without departing from the scope of the invention as defined by the following claims.

What is claimed is:

1. A method of printing a color image in a printing process comprising the sequential steps of creating a plurality of color separated halftones of the image, forming the halftones of the image from a liquid medium applied to a substrate, and embossing the liquid medium to form a plurality of surface relief configurations thereon, each halftone of the image having a different surface relief configuration formed thereon so as to reflect a different color when the embossed halftones are viewed at a specific angle whereby the embossed halftones create a printed copy of the color image.

2. The method of claim 1 wherein the creating step includes photographing the image to be printed through a distinctly configured color separation halftone screen.

3. The method of claim 1 wherein the creating step includes creating halftones of the image for three primary colors.

4. The method of claim 3 wherein the color image is created by the mixing of primary colors.

5. The method of claim 3 wherein the primary colors are blue, red and green.

6. The method of claim 3 wherein the primary colors are yellow, magenta and cyan.

7. The method of claim 1 wherein the forming step includes forming halftones of the image from the liquid medium with a rotary printing press.

8. The method of claim 1 wherein the substrate is printing stock and the liquid medium is a photopolymer ink and the forming step includes applying the photopolymer ink to the printing stock through the process of offset lithography.

9. The method of claim 1 wherein the forming step includes applying the liquid medium on the substrate in a pattern of the color separated halftones of the image.

10. The method of claim 9 wherein the applying step includes applying the liquid medium on the substrate in the pattern of the color separated halftones of the image in a single printing pass.

11. The method of claim 10 wherein the applying step includes applying the liquid medium in the pattern of the color separated halftone images in a single printing pass with a composite printing plate containing a pattern of the color separated halftones of the image.

12. The method of claim 9 wherein the applying step includes applying the liquid medium for each color separated halftone of the image in a printing pass with a printing plate containing said halftone image thereon.

13. The method of claim 1 wherein the surface relief configurations are each diffraction gratings.

14. The method of claim 13 wherein each diffraction grating consists of a plurality of substantially parallel grooves, the cross-section of each groove being substantially symmetrical about a centerline.

15. The method of claim 14 wherein the angle of the groove centerline of each diffraction grating is different from the angle of the groove centerline of each other diffraction grating.

16. The method of claim 13 wherein the cross-section of a diffraction grating is substantially "V" shaped.

17. The method of claim 13 wherein the cross-section of a diffraction grating is substantially parabolic in shape.

18. The method of claim 1 wherein the embossing step includes forming each surface relief configuration with an embossing plate having a surface constructed to produce a surface relief configuration when pressed against the liquid medium.

19. The method of claim 1 wherein embossing step includes forming the surface relief configurations with an embossing plate having a surface constructed to produce a different surface relief configuration on each halftone of the image when the embossing plate is pressed against the liquid medium.

20. The method of claim 1 wherein the embossing step includes using a rotary embossing drum to emboss the liquid medium.

21. The method of claim 1 wherein the liquid medium is a single color.

22. The method of claim 1 wherein the liquid medium is transparent.

23. A method of printing a color image comprising the steps of creating three distinctly configured color separated halftones of the image, creating a printing plate having a pattern of the three color separated halftones of the image thereon, applying a single ink with the printing plate in a printing process to printing stock to produce the pattern of the three color separated halftones of the image on the printing stock, embossing the ink with an embossing plate to produce a different diffraction grating on each color separated halftone of the image and curing the ink, the three color separated halftones of the image each reflecting a different color when the ink is viewed at a specific angle so as to create a printed copy of the color image.

24. The method of claim 23 wherein the applying step includes applying the ink to the printing stock in a rotary printing process.

25. The method of claim 23 wherein the embossing step includes embossing the ink in a rotary printing process.

* * * * *